United States Patent
Wu et al.

(10) Patent No.: US 6,486,667 B1
(45) Date of Patent: Nov. 26, 2002

(54) COMBINATION OF FLUID-ATTENUATED INVERSION-RECOVERY COMPLEX IMAGES ACQUIRED USING MAGNETIC RESONANCE IMAGING

(75) Inventors: Dee H. Wu, Shaker Heights, OH (US); David L. Foxall, Mentor, OH (US); Francis H. Bearden, Twinsburg, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 26 days.

(21) Appl. No.: 09/656,620

(22) Filed: Sep. 7, 2000

Related U.S. Application Data
(60) Provisional application No. 60/193,798, filed on Mar. 31, 2000.

(51) Int. Cl.[7] .................................................. G01V 3/00
(52) U.S. Cl. ...................... 324/306; 324/309; 324/307
(58) Field of Search ................................ 324/300, 301, 324/306, 307, 308, 309, 318, 322, 312

(56) References Cited

U.S. PATENT DOCUMENTS

| | | | |
|---|---|---|---|
| 4,845,430 A | | 7/1989 | Nakabayashi ................ 324/309 |
| 5,167,232 A | | 12/1992 | Parker et al. ................. 600/419 |
| 5,357,200 A | * | 10/1994 | Kajiyama ..................... 324/309 |
| 5,408,180 A | * | 4/1995 | Mistretta et al. ............. 324/306 |
| 5,528,144 A | | 6/1996 | Gullapalli et al. ........... 324/306 |
| 6,150,814 A | * | 11/2000 | Redpath et al. .............. 324/307 |
| 6,259,250 B1 | * | 7/2001 | Mock .......................... 324/309 |
| 6,285,187 B1 | * | 9/2001 | Mock .......................... 324/309 |
| 6,380,736 B1 | * | 4/2002 | Hajnal ......................... 324/306 |
| 6,420,870 B1 | * | 7/2002 | Kiefer ......................... 324/307 |

FOREIGN PATENT DOCUMENTS

| | | |
|---|---|---|
| EP | 0 398 440 A1 | 11/1990 |
| EP | 0 497 402 A1 | 8/1992 |
| EP | 759 561 | 2/1997 |
| EP | 0759561 A2 * | 2/1997 |
| EP | 959 366 | 11/1999 |

OTHER PUBLICATIONS

Falconer, et al., "Cerebrospinal Fluid–Suppressed High Resolution Diffusion Imaging of Human Brain", MRM 37:119–123 (1997).

J. V. Hajnal, et al., "Use of Fluid Attenuated Inversion Recovery (FLAIR) Pulse Sequences in MRI of the Brain," *Journal of Computer Assisted Tomography*, 1992, pp. 841–844.

* cited by examiner

Primary Examiner—Edward Lefkowitz
Assistant Examiner—Tiffany A. Fetzner
(74) Attorney, Agent, or Firm—Fay, Sharpe, Fagan, Minnich & McKee, LLP (57) ABSTRACT

A method of MRI includes supporting a subject in an examination region of an MRI scanner, and setting up a spin system with a net magnetization. An inversion pulse is applied which inverts the magnetization of the spin system in a selected volume of the subject. As the magnetization re-grows, a first set of raw data is generated by acquiring MR signals from a series of regions within the selected volume. For the first set of raw data, the series of regions are acquired in a first temporal order with respect to the inversion pulse. The inversion pulse is re-applied, and as the magnetization re-grows, a second set of raw data is generated in similar fashion to the first. However, for the second set of raw data, the series of regions are acquired in a second temporal order with respect to the inversion pulse. The second temporal order is different from the first temporal order. From the first and second sets of raw data, respectively, first and second sets of complex image data are generated. A complex phase correction factor is then determined and applied to one of, or both, the first and second sets of complex image data to thereby phase match the same. A combined image is generated via a pixel by pixel complex combination of the phase matched first and second sets of complex image data.

20 Claims, 2 Drawing Sheets

COMBINATION OF FLUID-ATTENUATED INVERSION-RECOVERY COMPLEX IMAGES ACQUIRED USING MAGNETIC RESONANCE IMAGING

This application claims the benefit of U.S. Provisional Application No. 60/193,798, filed Mar. 31, 2000.

BACKGROUND OF THE INVENTION

The present invention relates to the art of diagnostic medical imaging. It finds particular application in conjunction with magnetic resonance imaging (MRI), and will be described with particular reference thereto. However, it is to be appreciated that the present invention is also amenable to other like applications.

Commonly, in MRI, a substantially uniform temporally constant main magnetic field, $B_0$, is set up in an examination region in which a subject being imaged or examined is placed. Nuclei in the subject have spins which in the presence of the main magnetic field produce a net magnetization. The nuclei of the spin system precess in the magnetic field at the Larmor frequency, i.e., the resonant frequency. Radio frequency (RF) magnetic fields at and/or near the resonant frequency are used to manipulate the net magnetization of the spin system. Among other things, RF magnetic fields at the resonant frequency are used to, at least partially, tip the net magnetization from alignment with the main magnetic field into a plane transverse thereto. This is known as excitation, and the excited spins produce a magnetic field, at the resonant frequency, that is in turn observed by a receiver system. Shaped RF pulses applied in conjunction with gradient magnetic fields are used to manipulate magnetization in selected regions of the subject and produce a magnetic resonance (MR) signal. The resultant MR signal may be further manipulated through additional RF and/or gradient field manipulations to produce a series of echoes (i.e., an echo train) as the signal decays. The various echoes making up the MRI signal are typically encoded via magnetic gradients set up in the main magnetic field. The raw data from the MRI scanner is collected into a matrix commonly known as k-space. Typically, each echo is sampled a plurality of times to generate a data line or row of data points in k-space. The echo or data line's position in k-space (i.e., its relative k-space row) is typically determined by its gradient encoding. Ultimately, in an imaging experiment, by employing Inverse Fourier or other known transformations, an image representation of the subject is reconstructed from the k-space (or reciprocal space) data.

Fluid-attenuation inversion recovery (FLAIR) is a popular MRI technique employed to suppress unwanted signal from fluid near or around tissue that an operator wishes to visualize. It has been found particularly useful in brain scans and spinal imaging where brain tissue or spinal tissue is of interest and MR signal from surrounding cerebral spinal fluid (CSF) is undesirable. For example, FLAIR pulse sequences are commonly used to provide improved conspicuity of lesions located in regions of the body near CSF.

Where FLAIR is used to evaluate abnormalities in the brain and spine, suppression of the CSF in the images is commonly desired so that contrast differences in lesions, tumors, and edema in tissue proximal to the CSF will be enhanced. The application and timing of the inversion recovery (IR) RF pulses in MRI often dictate the type of contrast that is produced during a FLAIR acquisition. FLAIR sequences that apply selective IR RF pulses may, however, produce overly long acquisition times and may exhibit problematic in-flow artifacts such as those produced by CSF motion. This type of FLAIR is known as selective FLAIR.

As an alternative to selective FLAIR, non-selective (NS) FLAIR was developed. In NS-FLAIR, a single (or reduced number of) non-selective inversion pulse(s) that excites the entire region is applied before the acquisition pulses produced at each desired slice position (i.e., read out and turn on the data acquisition). Different tissue types (which have various relaxation characteristics) will produce different levels of signal amplitude depending on when the slices were acquired relative to the timing of the inversion recovery pulse. NS-FLAIR also reduces the CSF in-flow artifact because the inversion excites a large region. Since only a single inversion pulse is applied, NS-FLAIR sequences also provide faster acquisition times. However, imaging contrast is not as consistent through the slices when compared to selective IR excitation. The contrast in NS-FLAIR is typically dictated by the time when the slice was acquired relative to the NS inversion recovery RF pulse.

Moreover, in previously developed NS-FLAIR techniques, it has been suggested that the signed real values of images from two acquisitions (one with the original slice ordering and one with reverse slice order) are to be added together. In this way, the CSF signal amplitudes of each slice can be made more constant. However, this technique is less than optimal. Moreover, no explicit method for compensating for general phase differences between the images was considered, and the signal-to-noise ratio (SNR) has been shown to be worse when no phase correction is applied in connection with NS-FLAIR images.

The present invention contemplates a new and improved NS-FLAIR method which overcomes the above-referenced problems and others.

SUMMARY OF THE INVENTION

In accordance with one aspect of the present invention, a method of magnetic resonance imaging includes supporting a subject in an examination region of an MRI scanner, and setting up a spin system with a net magnetization in the subject. An RF inversion pulse is applied via the MRI scanner. The RF inversion pulse inverts the magnetization of the spin system in a selected volume of the subject. As the magnetization re-grows, a first set of raw data is generated by acquiring MR signals from a series of regions within the selected volume. For the first set of raw data, the series of regions are acquired in a first temporal order with respect to the RF inversion pulse. The RF inversion pulse is re-applied, and as the magnetization re-grows, a second set of raw data is generated by acquiring MR signals from the same series of regions. However, for the second set of raw data, the series of regions are acquired in a second temporal order with respect to the RF inversion pulse. The second temporal order is different from the first temporal order.

From the first and second sets of raw data, respectively, first and second sets of complex image data are generated. A complex phase correction factor is then determined and applied to one of, or both, the first and second sets of complex image data to thereby phase match the first and second sets of complex image data with one another. Ultimately, a combined image is generated. The combined image is generated via a pixel by pixel complex combination of the phase matched first and second sets of complex image data.

In accordance with another aspect of the present invention, a magnetic resonance imaging apparatus includes a main magnet that generates a substantially uniform temporally constant main magnetic field through an examination region wherein an object being imaged is positioned. A magnetic gradient generator produces magnetic gradients in the main magnetic field across the examination region, and a transmission system includes an RF transmitter that drives an RF coil which is proximate to the examination region. A sequence control manipulates the magnetic gradient generator and the transmission system to produce an NS-IR sequence. The NS-IR sequence induces detectable magnetic resonance signals from the object.

A reception system includes a receiver that receives and demodulates the magnetic resonance signals to obtain first and second sets of raw data. The first set of raw data represents a series regions from a selected volume of the object which was excited by an RF inversion pulse from the NS-IR sequence. The first series of regions are acquired in a first temporal order with respect to the RF inversion pulse. The second set of raw data represents the same series of regions, wherein the series of regions are acquired in a second temporal order which is different from the first temporal order.

The apparatus further includes a k-space storage device into which the first and second sets of raw data are rebinned as first and second sets of k-space data, respectively. A reconstruction processor subjects the first and second sets of k-space data to a reconstruction algorithm to generate first and second sets of complex image data, respectively, which are loaded into a complex image data storage device. A phase correction processor operates on one of, or both, the first and second sets of complex image data to thereby phase match the first and second sets of complex image data with one another. An image generator combines the phase matched first and second sets of complex image data into combined image data, and an output device produces human-viewable image representations of the object from data output by the image generator.

One advantage of the present invention is improved visualization of a selected tissue type (e.g., brain tissue or CSF) with suppression of the undesired tissue type.

Another advantage of the present invention is that tissue segmentation can be achieved thereby allowing tissue isolation and identification to aid in tissue specific processing of pixel data.

Another advantage of the present invention is optimized phase matching between data sets in an NS-FLAIR experiment.

Yet another advantage of the present invention is relatively shorter imaging time as compared to comparable selective FLAIR experiments.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
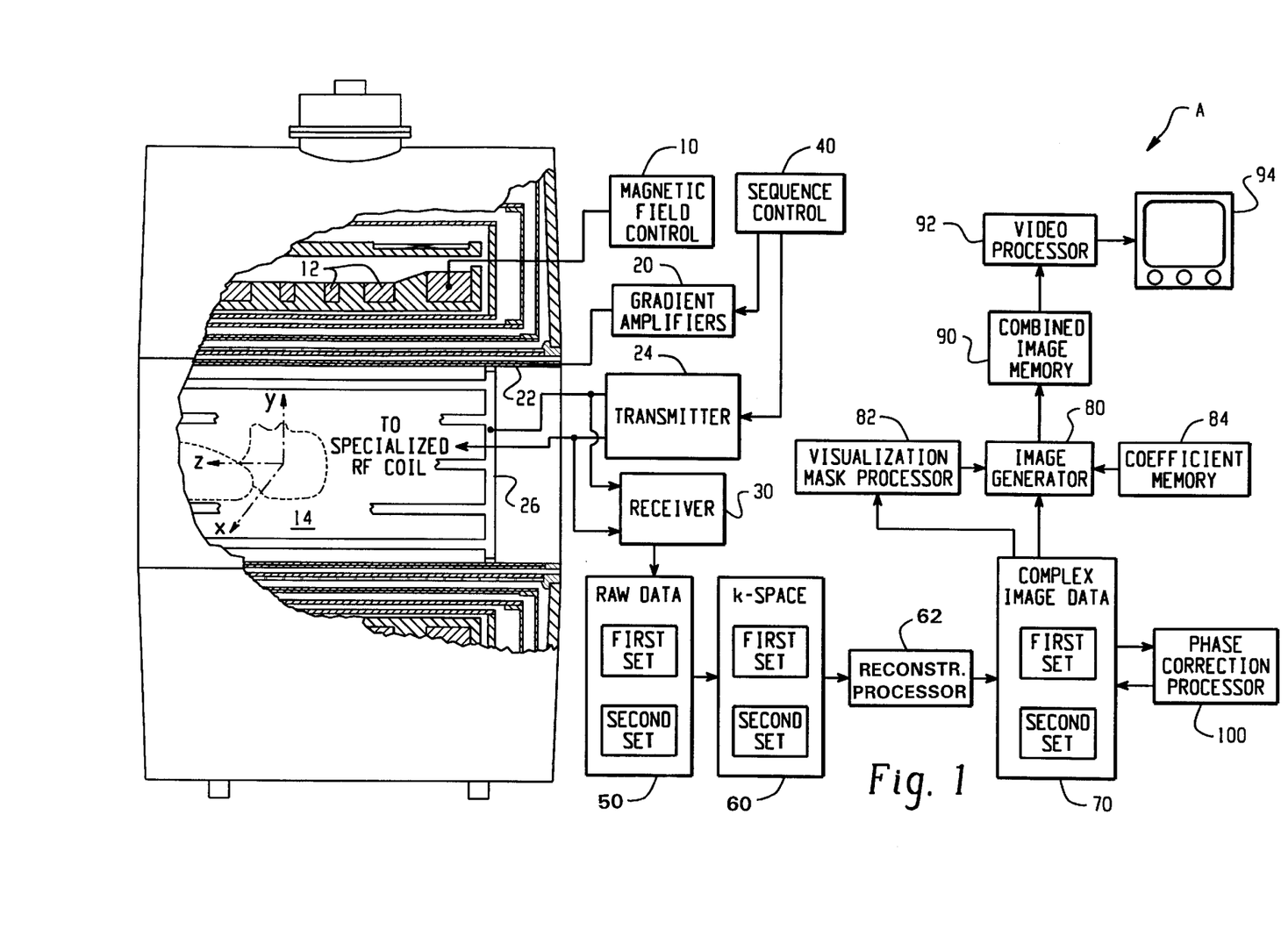
FIG. 1 is a diagrammatic illustration of a magnetic resonance imaging scanner in accordance with aspects of the present invention; and, FIG. 2 is a diagrammatic illustration of a phase correction processor in accordance with aspects of the present invention.

With reference to FIG. 1, an MRI scanner A includes a main magnetic field control 10 that controls superconducting or resistive magnets 12 such that a substantially uniform, temporally constant main magnetic field, $B_0$, is created along a z-axis through an examination region 14. In a subject (e.g., patient, phantom, or otherwise) placed within the examination region 14, the magnetic field sets up a spin system having a net magnetization. An imaging experiment is conducted by executing a magnetic resonance sequence with the subject being imaged or examined placed at least partially within the examination region 14. The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a gradient coil assembly 22 to set up magnetic field gradients in the main magnetic field along x, y and z-axes of the examination region 14. An RF transmitter 24, optionally digital, applies electrical RF pulses or pulse packets to an RF coil (optionally, a whole-body RF coil 26) to generate RF magnetic fields (at resonance) in the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed contiguous to or near the selected region. For example, as is known in the art, an insertable head coil (not shown) may be inserted surrounding a selected brain region at the isocenter of the bore, a selected surface coil (not shown) may be employed, a set of phased-array coils, or other such specialized RF coils may be employed. In addition to generating RF pulses, optionally, the local RF coil also receives magnetic resonance signals from the selected region. In still other embodiments or applications, the whole-body RF coil 26 generates the RF pulses while the local RF coil receives the resulting magnetic resonance signals or vice versa.

Regardless of the RF coil configuration, the resultant RF magnetic resonance signals are picked up by one or another of the RF coils employed and demodulated by a receiver 30, optionally a digital receiver. Preferably, a sequence control circuit 40 controls the gradient pulse amplifiers 20 and the RF transmitter 24 to produce an MRI pulse sequence that generates encoded magnetic resonance (MR) signals or echoes which are received and sampled by the receiver 30 as raw MR data.

The MRI experiment conducted is preferably a non-selective FLAIR (NS-FLAIR) experiment. More specifically, the NS-FLAIR experiment is characterized by an initial inversion pulse (i.e., an RF pulse applied by the transmitter 24 via an appropriate RF coil) which is applied to an entire volume. The inversion pulse inverts the magnetization of a spin system set up in a selected or desired volume of the subject, i.e., the volume of interest that is going to be imaged. Thereafter, as the magnetization re-grows, MR signals are successively read for multiple slices within the volume using a multi-slice readout pulse sequence, such as a fast spin echo (FSE) sequence or other known readout pulse sequence. Each of the acquired slices preferably represents a parallel planar cross-sectional slab or slice from which the MR signal is detected or received. Optionally, when stacked together, the slices make up the volume being imaged. However, as each slice is acquired at a different time during the re-growth of the magnetization, they each exhibit a different contrast.

While discussed herein with reference to NS-FLAIR, it is to be appreciated that the present invention is equally applicable to other NS-IR experiments involving tissues with different relaxation characteristics. Additionally, while slices and two-dimensional imaging techniques are being used for exemplary purposes herein, it is to be appreciated that the present invention is equally applicable to three-dimensional imaging techniques where volumes are substituted for the slices.

In any event, the raw MR data from the receiver 30 is collected and stored in a raw data memory 50, or other suitable storage device. The raw MR data is preferably acquired or collected twice for the same spatial volume, i.e., in two sets. The sets are nominally termed herein the first set and the second set. The first set represents a series of slices (i.e., selected cross-sectional slabs through the subject in the region of interest from which the relevant MR signal is detected) which are collected in a first temporal order with respect to the inversion pulse (i.e., the inversion pulse employed in connection with the NS-FLAIR experiment), and the second set represents the same series of slices collected in a second temporal order with respect to the inversion pulse, where the second temporal order is different from the first temporal order. Preferably, the second temporal order is the reverse of the first temporal order. Accordingly, the spatial position of the first acquired slice in the first set is the same as the spatial position of the last acquired slice in the second set; the spatial position of the second acquired slice in the first set is the same as the spatial position of the second-to-last acquired slice in the second set; and so on, until, the spatial position of the last acquired slice in the first set is the same as the spatial position of the first acquired slice in the second set. Optionally, more than two sets may be similarly employed. However, for purposes herein, discussion is directed to only two sets.

In alternate embodiments, it may be equally convenient to acquire slices in any desired order for the first set and in any desired order for the second set, as long as an estimate for signal values are known, the images can be combined. However, where reverse ordering is employed, it is preferred that the center time or mid-point of the acquisition sequence coincide with the null point of magnetization re-growth.

The raw data memory 50 is preferably partitioned into two three-dimensional (3D) regions. For each of the two sets, the respective 3D regions hold the corresponding data for the series of two-dimensional (2D) slices. Preferably, the other like memories or storage devices described herein are similarly configured.

In the usual manner, k-space data is then produced from the first and second sets of raw MR data in the raw data memory 50. More specifically, the first and second sets of raw MR data get mapped, rebinned and/or otherwise load into corresponding k-space matrices. The k-space data is preferably held or stored in a k-space memory 60, or other suitable storage device. Depending on the readout pulse sequence employed, the usual k-space data corrections and/or processing is carried out. For example, where a FSE readout sequence is used, a phase correction is optionally applied to properly align the data in k-space.

For each slice in each of the two sets, a reconstruction processor 62, acting on the k-space data from the memory 60, reconstructs corresponding image representations of the subject by applying a two-dimensional Fourier transform (2DFT) or other appropriate reconstruction algorithm. The resulting image for each slice is a matrix or 2D pixel array of complex intensity values, the magnitudes of which represent or visualize the corresponding slice or slab through the subject. In this manner, complex image data is generated corresponding to the first and second sets of data. The first and second sets of complex image data are preferably loaded and stored in a complex image data memory 70 such that each complex data value represents an element or pixel of its respective image.

Figure 2:
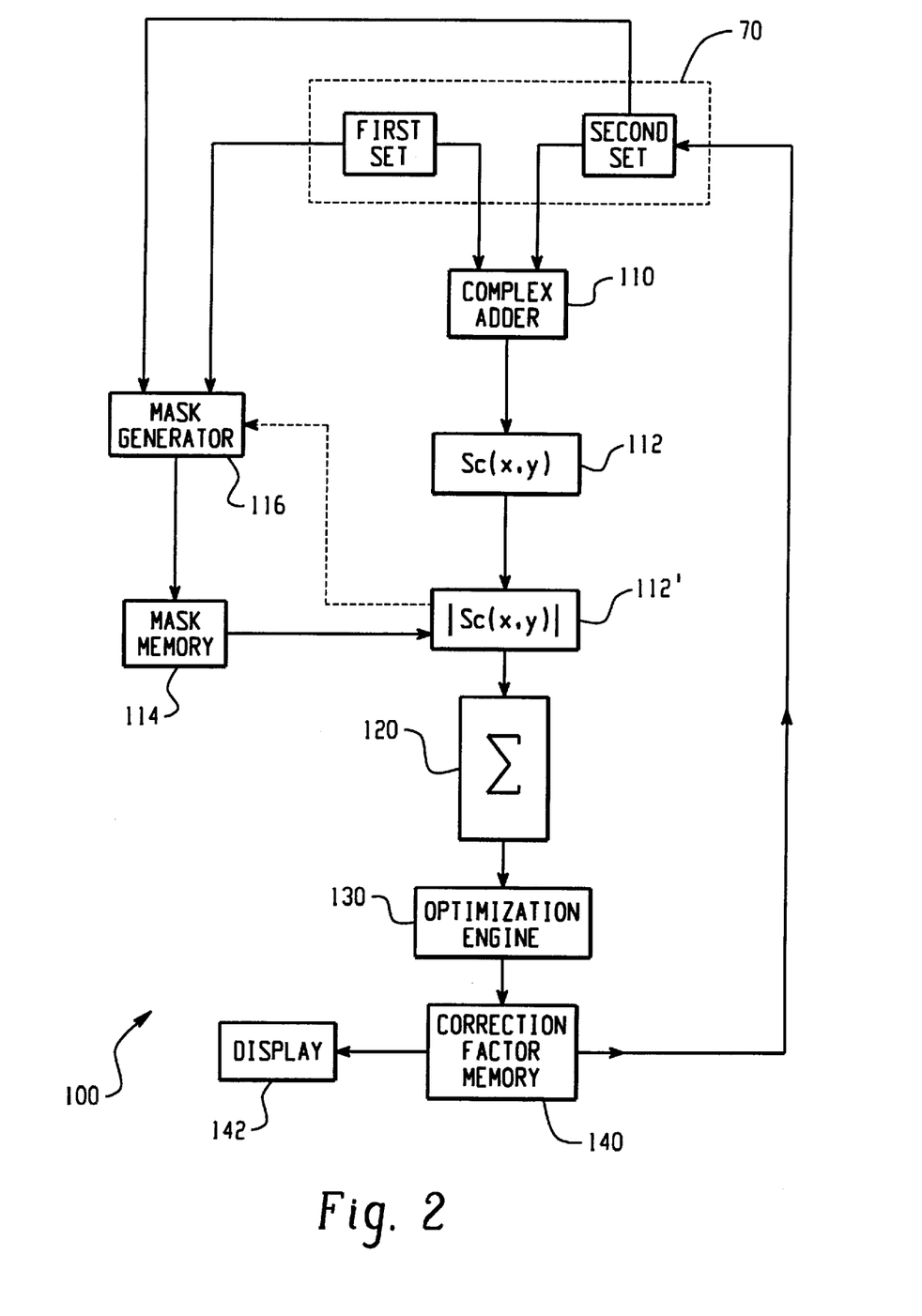

With further reference to FIG. 2, corresponding slices (i.e., slices having the same spatial position) from the first and second sets of k-space data are then phase matched to one another by a phase correction processor 100. That is to say, phase matching substantially eliminates phase differences between the first and second data sets. Preferably, the phase matching is carried out on a slice by slice basis. Accordingly, for simplicity herein, the description of phase matching which follows is limited to a single spatial slice location. However, it is to be understood that the phase matching is preferably carried out similarly for each spatial slice location in the volume of interest.

In a preferred embodiment, the phase matching is an iterative operation or procedure. It begins by combining, in the complex domain, the respective complex image data from the first and second sets, preferably, on a pixel by pixel basis. More specifically, using complex addition with a complex phase factor, an adder 110 sums the complex image data from the first set with the complex image data from the second set. This can be mathematically represented as follows:

$$s_c(x,y)=s_1(x,y)+e^{-iz}s_2(x,y) \quad (1);$$

where $s_c(x,y)$ represents the resulting sum, $s_1(x,y)$ represents the first set of complex image data, $e^{-iz}$ represents the complex phase factor, and $s_2(x,y)$ represents the second set of complex image data. Initially, the complex phase factor is set to, or selected as, a first best estimate. This first best estimate is optionally the most recent or last estimated value, some other reasonably predicted value based on historical data or results, or is determined by other like criteria. Without loss of generality, the complex phase factor is alternately applied to the first set of complex image data. Moreover, complex phase factors may be applied to both sets of complex image data to match them both to a predetermined or otherwise selected absolute phase. Nevertheless, in the interest of simplicity herein, we shall consider in this example the case represented in equation (1) above. Preferably, the summed complex image data, $s_c(x,y)$, is loaded and stored in a memory 112, or other suitable storage device.

Next, the summed complex image data, $s_c(x,y)$, from memory 112 is evaluated. That is to say, a qualitative and/or quantitative analysis is done to determine the degree of phase matching achieved with the employed complex phase factor, $e^{-iz}$. In a preferred embodiment, the evaluation is carried out by first obtaining a magnitude image from the summed complex image data, this can be mathematically represented by $|s_c(x,y)|$. That is to say, the individual magnitude for each complex image element or pixel of the summed complex image data is calculated. This magnitude image, $|s_c(x,y)|$, is optionally held in the same memory 112 or a new memory location 112'.

Then, a summing circuit or processor 120 sums the magnitudes of all the pixels in the 2D array or matrix. This can be represented mathematically as follow:

$$Q = \sum_x \sum_y |s_c(x, y)|; \qquad (2)$$

where Q represents the sum of magnitudes, x represents the pixel column, and y represents the pixel row. The sum of magnitudes, Q, represents a numeric cost function or figure of merit that provides a measure of phase matching. By optimizing the sum, Q, a minimum phase differential is realized. In other words, phase matching between the two sets of complex image data is maximized, and in turn, image sharpness is maximized in a combined image. Alternately, other known image evaluation techniques may be employed for determining the degree or level of phase matching present.

In a preferred embodiment, during evaluation of Q, a mask is optionally applied (i.e., multiplied) to the magnitude image represented by $|s_c(x,y)|$. This can be mathematically expressed as follows:

$$Q = \sum_x \sum_y |s_c(x, y)| \cdot mask\,(x, y); \qquad (3)$$

where mask (x,y) represents the mask. Preferably, the mask is applied after the first iteration of the phase matching procedure. The mask is generated and stored in a mask memory 114, or other suitable storage device. Preferably, to conserve processing time, when the mask is applied, Q is summed over only for those pixels where the mask values are 1 (as described below).

The mask is generated by a mask generator 116. To yield a desired image contrast (such as, high signal from brain tissue and low signal from cerebral spinal fluid (CSF), or vice versa), the mask generator 116 alternately performs a complex addition or subtraction between the first and second sets of complex image data from memory 70, and calculates a magnitude image from the result. The addition or subtraction is preferably carried out in conjunction with the first or most recent estimate of the complex phase factor applied to the second set of complex image data. In the case of addition, the magnitude image already calculated in the evaluation procedure can optionally be used.

In the mask generator 116, addition enhances or cooperatively operates on pixel intensity or signal for a first tissue type (preferably, brain tissue), while suppressing or destructively operating on pixel intensity or signal for a second tissue type (preferably, cerebral spinal fluid (CSF)). Conversely, subtraction enhances or cooperatively operates on pixel intensity or signal for the second tissue type (i.e., CSF), while suppressing or destructively operating on pixel intensity or signal for the first tissue type (i.e., brain tissue). Accordingly, addition is used in producing a brain tissue mask (i.e., a mask that is used to zero out or substantially reduce the brain tissue values), and subtraction is used in producing a CSF mask (i.e., a mask that is used to zero out or substantially reduce the CSF values).

It is significant to note that via the masking, either desired tissue type can be segmented out by selectively using either the complex addition or complex subtraction. The segmenting out of desired tissue types is clinically useful in volumetrics. That is to say, a count of the pixels or voxels for the particular tissue multiplied by each pixel's or voxel's representative area or volume gives the total area or volume for that tissue. In this manner, the size of the tissue can be determined. optionally, the term "tissue" type as used herein encompasses other pixel types, e.g., pixels representing air, background or the like.

In any case, the mask generator 116 preferably makes the mask binary via a thresholding procedure. More specifically, where the signal or pixel intensity of the added or subtracted image exceeds a predefined or otherwise selected threshold value, the mask pixel is turned off or set to 0, and where it does not, the mask pixel is turned on or set to 1. In this manner, the brain tissue mask tends to have the relatively higher-signal brain tissue pixels from the addition turned off or set to 0, while the suppressed CSF pixels from the addition are turned on or set to 1, so that when applied, brain tissue pixels are masked out while CSF pixels remain unaltered. Conversely, the CSF mask tends to have the relatively higher-signal CSF pixels from the subtraction turned off or set to 0, while the suppressed brain tissue pixels from the subtraction are turned on or set to 1, so that when applied, CSF pixels are masked out while brain tissue pixels remain unaltered. Two other masks that are alternately generated and employed are the complements, respectively, of the CSF mask and the brain tissue mask. Moreover, the masks may be updated as new or next best estimates of the complex phase factor are computed.

In a preferred embodiment, using the value from the summing processor 120 as the cost function or figure of merit, an optimization engine 130 performs a mathematical optimization to generate the next best estimate for the complex phase factor, $e^{-iz}$. Once generated, the new complex phase factor is loaded and stored in the correction factor memory 140 for use in the next iteration of the phase matching procedure. That is to say, with each following iteration, the second set of complex image data is multiplied by the complex phase factor generated and stored in the correction factor memory 140 from the proceeding iteration. Optionally, a human-viewable display 142 also accesses the correction factor memory 140 to display the complex phase factor stored therein to the operator or other observers.

Preferably, the optimization engine 130 employs a Nelder-Mead optimization technique. See, e.g., a description of the Nelder-Mead algorithm in "Numerical Recipes in C" by Press, Flannery, Teukolsky, and Vetterling, 1988, Cambridge University Press, incorporated herein by reference. Alternately, known non-linear mathematical optimization techniques may be substituted, or other known optimization techniques (e.g., a golden section technique, a direct gradient descent technique, etc.) may be used.

With each phase matching procedure, a number of iterations can be carried out. However, preferably, there is no set number of iterations. Rather, the phase matching procedure continues iteratively in the manner described until defined parameters do not substantially change. For example, it may continue until the difference between an immediately preceding complex phase factor and a current complex phase factor falls within a predetermined or otherwise selected tolerance. Alternately, the phase matching procedure continues iteratively in the manner described until the difference between an immediately preceding value of the cost function and a current value of the cost function falls within a predetermined or otherwise selected tolerance. In either case, when the difference is within tolerance, the current complex phase factor is designated for future use in reconstructing the NS-FLAIR data. In this manner, the complex phase factor is generated by the phase correction processor 100.

Alternately, other phase matching or correction techniques may be implemented by the phase correction processor 100 to substantially eliminate a phase differential between the complex image data from the first and second sets. For example, the complex conjugate of one of the two sets of complex image data in memory 70 is taken, and thereafter, the complex product of the two sets is calculated on a pixel by pixel basis. Then, the arctangent of the product values for each pixel is taken, and a weighted average of the results computed. The weighting is preferably based on the corresponding pixel intensity in the product image. The resulting weighted average of the arctangent values is then used as the phase correction factor. Optionally, the pixels in the product image can first be summed in the complex domain over the entire image, and the arctangent then taken of the resulting sum to achieve the phase correction factor. In either case, the arctangent technique may be iteratively repeated until the phase correction factor is optimized.

In still other alternate embodiments, the k-space data from memory 50 or the raw data from memory 40 may be used by the phase correction processor 100 to generate the appropriate phase correction factor.

In any event, after the appropriate phase correction factor (as determined by the phase correction processor 100) has been applied, the two sets of phase matched complex image data from memory 70 are accessed and combined by an image generator 80. Preferably, the combination is implemented as a pixel by pixel complex addition of the two phase match sets of complex image data followed by a magnitude calculation therefor. optionally, the combination, already generated, may be accessed directly from memory 112 or 112'. The combined image is then stored in a combined image memory 90 where it may be accessed by a video processor 92 that prepares and/or formats the combined image for display on a video monitor 94 or other such output device that provides a human-readable depiction or rendering of the resultant image.

In addition, to improve visualization of a desired tissue (e.g., brain tissue or CSF), the image generator 80 optionally applies a mask from a visualization mask processor 82 to the combined image. The mask employed is the one that masks out the undesired tissue, most often, CSF. The visualization mask processor 82 preferably generates the desired mask in essentially the same manner set forth above. Optionally, the mask, already generated, is simply accessed from the mask memory 114. In an alternate embodiment, however, the masks used for visualization may not be binary. That is to say, the thresholding procedure is optionally implemented such that the mask is generated with a number of gray-scale values between the on and off extremes. Accordingly, pixels having signal intensities measuring within some middle range or ranges are quantized to the appropriate intermediate gray value or values. This technique is alternately known as gray-scale masking or shape masking. In this manner, transitions between the tissues can be eased or slightly blurred for improved visualization without overly sharp edges or boundaries. Alternately, other techniques, such as region growing and/or morphological filtering, can be employed to improve smoothness and reduce dropouts (i.e., lost pixels).

In a preferred embodiment, a coefficient memory 84 stores a pair of different tissue specific coefficients (e.g., a brain tissue coefficient and a CSF coefficient) that are preferably empirically calculated or experimentally predetermined, and are optionally operator adjustable. The coefficients relate to the manner in which, or rate at which, magnetization re-growth occurs in their corresponding tissue type. The coefficients are employed by the image generator 80 as multiplicative amplitude corrective factors in the image combination performed thereby, with the respective coefficients being applied in the combination of pixels corresponding to the appropriate tissue type. That is to say, the tissue type for each pixel is determined from the relevant masks or otherwise. Accordingly, when a particular pixel of an identified tissue type is combined by the image generator 80, the corresponding tissue specific coefficient is accessed from the coefficient memory 84, and applied as a multiplicative factor in that pixels combination. optionally, the coefficients are also similarly employed when determining the complex phase factor.

In another preferred embodiment, the present invention is implemented in conjunction with phased-array RF coils. In this embodiment, raw data acquired from each coil in the phased-array of RF coils is collected and saved in memory. Thereafter, it can be combined in the complex domain or otherwise manipulated as desired.

Although a bore-type magnet is illustrated in FIG. 1, it is to be appreciated that the present invention is equally applicable to open magnet systems and other known types of MRI scanners.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging, said method comprising:

(a) supporting a subject in an examination region of an MRI scanner;

(b) setting up a spin system with a net magnetization in the subject;

(c) producing an inversion-recovery pulse sequence with the MRI scanner, said producing including:

(1) applying an RF inversion pulse via the MRI scanner, said RF inversion pulse inverting the magnetization of the spin system in a selected volume of the subject, and as the magnetization re-grows, generating a first set of raw data by acquiring MR signals from a series of regions within the selected volume, wherein for the first set of raw data the series of regions are acquired in a first temporal order with respect to the RF inversion pulse;

(2) re-applying the RF inversion pulse, and as the magnetization re-grows, generating a second set of raw data by acquiring MR signals from the same series of regions within the selected volume, although for the second set of raw data the series of regions are acquired in a second temporal order with respect to the RF inversion pulse, said second temporal order being different from the first temporal order such that for respective regions in the series an amplitude difference exits between the MR signals acquired for the first set of raw data and the MR signals acquired for the second set of raw data;

(d) generating first and second sets of complex image data from the first and second sets of raw data, respectively;

(e) determining a complex phase correction factor;

(f) applying the complex phase correction factor to one of, or both, the first and second sets of complex image data to thereby phase match the first and second sets of complex image data with one another; and, (g) generating a combined image, said combined image being generated via a pixel by pixel complex combination of the phase matched first and second sets of complex image data.

2. The method according to claim 1, wherein said method further comprises:

(h) obtaining a combined magnitude image from the combined image by computing magnitudes for each pixel of the combined image, wherein said pixels in the combined image are represented by complex data values.

3. The method according to claim 2, wherein said method further comprises:

(i) generating a mask which substantially zeros out visualization of an identified first pixel type while leaving substantially unaltered visualization of an identified second pixel type; and, (j) applying the mask to one of the combined magnitude image or the combined image.

4. The method according to claim 3, wherein generation of the mask comprises:

performing an operation on the phase matched first and second sets of complex image data to achieve a resulting complex mask image comprising pixels having complex values, said operation being selected from a group of operations consisting of complex addition and complex subtraction;

generating a magnitude mask image by calculating magnitudes for each complex valued pixel in the complex mask image; and, thresholding the magnitude mask image such that pixels having values in defined threshold ranges are set to quantized values corresponding to the respective threshold ranges.

5. The method according to claim 4, wherein the mask is selected from a group of masks consisting of a binary mask and a gray-scale mask.

6. The method according to claim 1, wherein the step of determining a complex phase correction factor is an iterative determination procedure such that each repetition thereof comprises:

estimating a value for the complex phase correction factor;

applying the complex phase correction factor to one of, or both, the first and second sets of complex image data using the estimated value;

generating a trial combined image, said trial combined image being generated via a pixel by pixel complex combination of the first and second sets of complex image data; and, evaluating the trial combined image to measure an amount of phase matching achieved.

7. The method according to claim 6, wherein for each repetition the iterative determination procedure further comprises:

employing the measure of phase matching achieved as a cost function in an optimization algorithm which generates a next estimate for the complex phase correction factor such that the next estimate is used in a following repetition of the iterative determination procedure.

8. The method according to claim 6, wherein the step of evaluating the trial combined image comprises:

obtaining a trial combined magnitude image from the trial combined image by computing magnitudes for each pixel of the trial combined image, wherein said pixels in the trial combined image are represented by complex data values; and, summing over all the pixels of the trial combined magnitude image.

9. The method according to claim 8, wherein the step of evaluating the trial combined image further comprises:

generating a mask which substantially zeros out an identified first pixel type while leaving substantially unaltered an identified second pixel type; and, applying the mask to the trial combined magnitude image prior to the summing step.

10. The method according to claim 9, wherein generation of the mask comprises:

performing an operation on the first and second sets of complex image data to achieve a resulting complex mask image comprising pixels having complex values, said operation being selected from a group of operations consisting of complex addition and complex subtraction;

generating a magnitude mask image by calculating magnitudes for each complex valued pixel in the complex mask image; and, thresholding the magnitude mask image such that pixels having values in defined threshold ranges are set to quantized values corresponding to the respective threshold ranges.

11. The method according to claim 1, wherein the step of determining a complex phase correction factor comprises:

converting one of the first and second sets of complex image data into is complex conjugate;

calculating the complex product of the complex conjugate and the other of the first and second sets of complex image data, said product comprising complex valued pixels;

taking the arctangent of the complex valued pixels in the product on a pixel by pixel basis; and, computing a weighted sum over all the arctangent results, said weighted sum representing the complex phase correction factor.

12. The method according to claim 1, wherein the step of determining a complex phase correction factor comprises:

converting one of the first and second sets of complex image data into its complex conjugate;

calculating the complex product of the complex conjugate and the other of the first and second sets of complex image data, said product comprising complex valued pixels;

computing a complex sum over all the complex valued pixels in the product; and, taking an arctangent of the complex sum, said arctangent of the complex sum representing the complex phase correction factor.

13. A method of magnetic resonance imaging, said method comprising:

(a) supporting a subject in an examination region of an MRI scanner;

(b) setting up a spin system with a net magnetization in the subject;

(c) producing an inversion-recovery pulse sequence with the MRI scanner, said producing including:

(1) applying an RF inversion pulse via the MRI scanner, said RF inversion pulse inverting the magnetization of the spin system in a selected volume of the subject, and as the magnetization re-grows, generating a first set of raw data by acquiring MR signals from a series of regions within the selected volume, wherein for the first set of raw data the series of regions are acquired in a first temporal order with respect to the RF inversion pulse;

(2) re-applying the RF inversion pulse, and as the magnetization re-grows, generating a second set of raw data by acquiring MR signals from the same series of regions used to generate the first set of raw data, wherein for the second set of raw data the series of regions are acquired in a second temporal order with respect to the RF inversion pulse, said second temporal order being different from the first temporal order with respect to RF inversion pulse;

(d) generating first and second sets of complex image data from the first and second sets of raw data, respectively;

(e) determining a complex phase correction factor;

(f) applying the complex phase correction factor to one of, or both, the first and second sets of complex image data to thereby phase match the first and second sets of complex image data with one another; and, (g) generating a combined image, said combined image being generated via a pixel by pixel complex combination of the phase matched first and second sets of complex image data, said complex combination including an application of pixel type specific coefficients in conjunction therewith such that separate coefficients are applied to those pixels identified as representing the pixel type to which the specific coefficient corresponds, said pixel type specific coefficients being multiplicative amplitude corrective factors related to the magnetization re-growth for the respective pixel type.

14. A magnetic resonance imaging apparatus comprising:

a main magnet that generates a substantially uniform temporally constant main magnetic field through an examination region wherein an object being imaged is positioned;

a magnetic gradient generator that produces magnetic gradients in the main magnetic field across the examination region;

a transmission system which includes an RF transmitter that drives an RF coil which is proximate to the examination region;

a sequence control which manipulates the magnetic gradient generator and the transmission system to produce an NS-IR sequence including an RF inversion pulse, said NS-IR sequence inducing detectable magnetic resonance signals from the object;

a reception system which includes a receiver that receives and demodulates the magnetic resonance signals to obtain first and second sets of raw data from respective NS-IR sequences, said first set of raw data representing a series of regions from a selected volume of the object that was excited by the RF inversion pulse from its NS-IR sequence, wherein the series of regions for the first set of raw data are acquired in a first temporal order with respect to its RF inversion pulse, and said second set of raw data representing the same series of regions from the selected volume of the object that was excited by the RF inversion pulse from its NS-IR sequence, wherein the series of regions for the second set of raw data are acquired in a second temporal order with respect to its RF inversion pluse, said second temporal order being different from the first temporal order with reference to the respective RF inversion pulses;

a k-space storage device into which the first and second sets of raw data are rebinned as first and second sets of k-space data, respectively;

a reconstruction processor that subjects the first and second sets of k-space data to a reconstruction algorithm to generate first and second sets of complex image data, respectively, which are loaded into a complex image data storage device;

a phase correction processor which operates on one of, or both, the first and second sets of complex image data to thereby phase match the first and second sets of complex image data with one another;

an image generator that combines the phase matched first and second sets of complex image data into combined image data; and, an output device that produces human-viewable image representations of the object from data output by the image generator.

15. The magnetic resonance imaging apparatus according to claim 14, wherein the image generator generates the combined image data by performing a complex summing of the first and second sets of complex image data on a pixel by pixel basis and then determining for each resulting complex valued pixel a magnitude therefor.

16. The magnetic resonance imaging apparatus according to claim 15, said apparatus further comprising:

a mask generator, said mask generator generating a mask which substantially zeros out an identified first pixel type while leaving substantially unaltered an identified second pixel type, wherein the mask is multiplied with the combined image data by the image generator.

17. The magnetic resonance imaging apparatus according to claim 16, wherein the mask generator generates the mask by:

performing an operation on the first and second sets of complex image data to achieve a resulting complex mask image comprising pixels having complex values, said operation being selected from a group of operations consisting of complex addition and complex subtraction;

generating a magnitude mask image by calculating magnitudes for each complex valued pixel in the complex mask image; and, thresholding the magnitude mask image such that pixels having values in defined threshold ranges are set to quantized values corresponding to the respective threshold ranges.

18. The magnetic resonance imaging apparatus according to claim 14, further comprising a coefficient memory that stores pixel type specific coefficients, said pixel type specific coefficients being multiplicative amplitude corrective factors related to the magnetization re-growth for the respective pixel type, wherein the image generator accesses the coefficient memory to obtain the pixel type specific coefficients and apply the pixel type specific coefficients in conjunction with its complex combination of the first and second sets of complex image data such that separate coefficients are applied to those pixels identified as representing the pixel type to which the specific coefficient corresponds.

19. The magnetic resonance imaging apparatus according to claim 14, wherein the phase correction processor includes an optimization engine that uses a calculated cost function to determine a complex phase correction factor which is applied to one of, or both, the first and second sets of complex image data to phase match the first and second sets of complex image data with one another.

20. The magnetic resonance imaging apparatus according to claim 19, wherein the calculated cost function is determined by:

estimating a value for the complex phase correction factor;

applying the complex phase correction factor to one of, or both, the first and second sets of complex image data using the estimated value;

generating a trial combined image, said trial combined image being generated via a pixel by pixel complex addition of the first and second sets of complex image data;

obtaining a trial combined magnitude image from the trial combined image by computing magnitudes for each pixel of the trial combined image, wherein said pixels in the trial combined image are represented by complex data values; and, summing over all the pixels of the trial combined magnitude image.

* * * * *